US008823411B2

(12) United States Patent
League

(10) Patent No.: US 8,823,411 B2
(45) Date of Patent: Sep. 2, 2014

(54) FATAL FAILURE DIAGNOSTICS CIRCUIT AND METHODOLOGY

(75) Inventor: Christopher M. League, Madison, AL (US)

(73) Assignee: Freescale Semiconductor, Inc., Austin, TX (US)

( * ) Notice: Subject to any disclaimer, the term of this patent is extended or adjusted under 35 U.S.C. 154(b) by 941 days.

(21) Appl. No.: 12/701,687

(22) Filed: Feb. 8, 2010

(65) Prior Publication Data

US 2011/0193580 A1 Aug. 11, 2011

(51) Int. Cl.
*G01R 31/26* (2014.01)
*G01R 31/40* (2014.01)

(52) U.S. Cl.
CPC ............ *G01R 31/40* (2013.01); *G01R 31/2621* (2013.01)
USPC ..................................................... 324/762.09

(58) Field of Classification Search
USPC ...................... 324/750.3, 762.01, 762.09, 537
See application file for complete search history.

(56) References Cited

U.S. PATENT DOCUMENTS

| | | | | |
|---|---|---|---|---|
| 5,550,497 | A * | 8/1996 | Carobolante | 327/110 |
| 5,914,545 | A * | 6/1999 | Pollersbeck | 307/131 |
| 6,469,564 | B1 * | 10/2002 | Jansen | 327/365 |
| 6,552,587 | B2 * | 4/2003 | Kim et al. | 327/158 |
| 6,930,500 | B2 * | 8/2005 | Srivastava | 324/762.02 |
| 7,369,386 | B2 | 5/2008 | Rasmussen et al. | |
| 7,414,442 | B2 * | 8/2008 | Uno | 327/112 |
| 7,944,285 | B1 * | 5/2011 | Thirunavukarasu et al. | 327/544 |
| 8,159,007 | B2 * | 4/2012 | Barna et al. | 257/268 |
| 2007/0076342 | A1 | 4/2007 | Arndt | |
| 2007/0165364 | A1 * | 7/2007 | Avian | 361/600 |
| 2008/0062604 | A1 * | 3/2008 | Brombach et al. | 361/100 |
| 2009/0024284 | A1 | 1/2009 | Bourbiel et al. | |
| 2009/0115489 | A1 | 5/2009 | Hemon et al. | |

OTHER PUBLICATIONS

Freescale Semiconductor, Inc., Single Intelligent High-Current Self-Protected Silicon High Side Switch, Document No. MC33982, Rev. 15.0, Jul. 2008.
Freescale Semiconductor, Inc., eXtreme Switch, Rev. 1, 2004.
Freescale Semiconductor, Inc., eXtreme Switch Protection Guides, Application Note AN3274, Rev. 3.0, May 2007.

* cited by examiner

*Primary Examiner* — Arleen M Vazquez
*Assistant Examiner* — Feba Pothen
(74) *Attorney, Agent, or Firm* — Terrile, Cannatti, Chambers & Holland, LLP; Michael Rocco Cannatti

(57) ABSTRACT

A fault diagnostic circuit (100) and associated method of operation are described for testing an FET device (114) for a gate-drain short failure (113) by floating the FET gate during a predetermined test period and then comparing (118) the FET output voltage (115) at the source to a predetermined threshold voltage ($V_{THRESHOLD}$) which may be selected as a percentage of the power supply voltage ($V_{POWER}$) for the FET device to determine if the FET output voltage is greater than the threshold voltage, in which case a device fault is signaled (119).

20 Claims, 2 Drawing Sheets

FATAL FAILURE DIAGNOSTICS CIRCUIT AND METHODOLOGY

BACKGROUND OF THE INVENTION

1. Field of the Invention

The present invention is directed in general to the field of electric circuits. In one aspect, the present invention relates to a switch arrangement for providing a switch failure signal.

2. Description of the Related Art

Switching circuits use field effect transistor (FET) devices to control the application of power in a variety of different applications, such as power switching applications for driving headlights, injector or braking valves and other automotive power supply applications. Increasingly, smart semiconductor switches have been developed for dynamically adjusting a load current and/or providing a current protection function by immediately switching OFF the load current upon sensing a current surge. For example, Freescale offers smart semiconductor switches in the MC33982 or MC33984 products as part of the eXtreme switch family of products. But even with high quality fabrication and testing processes that prevent or detect device defects, some of the switch FETs can become defective after a part has been shipped because of particle level defects and/or because of "over stress" conditions that are applied in the field, resulting in a damaged FET gate that is resistively shorted to the FET drain. When the switch enters a sleep mode and the damaged FET gate is allowed to float, the resistive gate-drain short will cause the floating gate voltage to rise toward the supply voltage at the drain, causing the FET to become partially enhanced so that the FET operates in the linear region. In the linear mode of operation, the FET can dissipate a large amount of heat, possibly causing a destructive thermal event. Currently, there is no way to notify the system of a switching circuit failure caused by a gate-drain short, and there is no way to prevent the failure from progressing into a thermal event.

Accordingly, a need exists for an improved switching circuit, system and method of operation that addresses various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Figure 1:
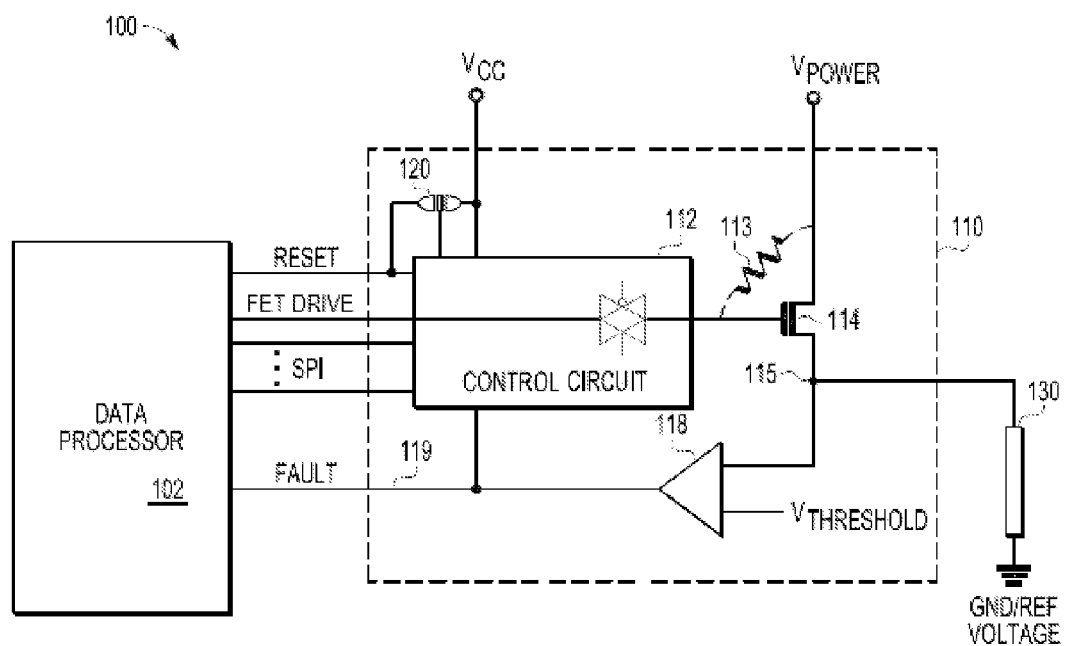
FIG. 1 is a simplified schematic circuit diagram of a failure diagnostics circuit in accordance with selected embodiments of the present invention.

The device fault diagnostic circuit and associated method of operation are described for testing an FET device for a gate-drain short failure by floating the FET gate during a predetermined test period and then comparing the FET output voltage at the source to a predetermined threshold voltage which may be selected as a percentage of the power supply voltage for the FET device. If the FET output voltage is greater than the threshold voltage, then a device fault is signaled, such as by setting a serial protocol interface (SPI) bus fault register flag or hardware fault flag. Upon detection of a device fault, a system level or device level containment may be applied to the damaged FET device, thereby preventing a thermal event at the device level and system level. The disclosed diagnostic test procedure may be applied at start-up, periodically, episodically, on user command, or on any other predetermined basis for performing a gate-drain short fault test.

Various illustrative embodiments of the present invention will now be described in detail with reference to the accompanying figures which illustrate functional and/or schematic block components and various processing steps. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected embodiments of the present invention are implemented, for the most part, with electronic components and circuits known to those skilled in the art, and as a result, circuit details have not been explained in any greater extent since such details are well known and not considered necessary to teach one skilled in the art of how to make or use the present invention. In addition, selected aspects are depicted with reference to simplified circuit schematics, logic diagrams, and flow chart drawings without including every circuit detail or feature in order to avoid limiting or obscuring the present invention. Such descriptions and representations are used by those skilled in the art to describe and convey the substance of their work to others skilled in the art. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated otherwise as apparent from the following discussion, it is appreciated that, throughout the description, discussions using terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 2:
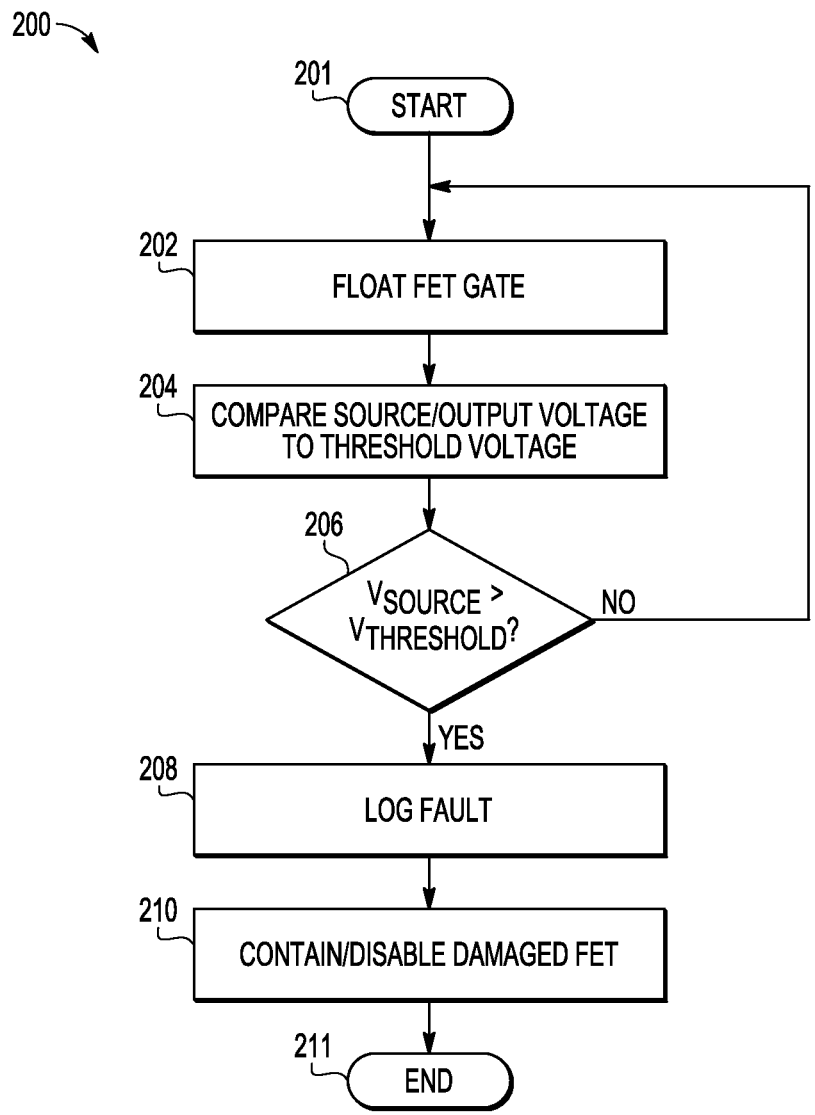
FIG. 2 illustrates a flow diagram for the operation of a failure diagnostics system in accordance with selected embodiments of the present invention.

Referring now to FIG. 2, there is shown a simplified schematic diagram of a failure diagnostics circuit 100 in accordance with selected embodiments of the present invention. The illustrated diagnostics circuit 100 includes a drive circuit 110 coupled to a load element 130, such as a static load, motor, light bulb. The drive circuit 110 includes control and power switching circuitry which may be implemented as an application specific integrated circuit (ASIC) that includes functionality for generating the output voltage signal 115 which is applied to the load element 130. More specifically, the drive circuit 110 may be implemented with a switch arrangement in which a first high side field effect transistor (FET) functioning as FET switch 114, such as a smart semiconductor switch or eXtreme, is coupled to the output load 130. During normal operation when the high side FET 114 is in an OFF state, a LOW voltage is applied by the control circuit 112 to the gate of the FET 114, and no current can flow through the load element 130. Alternatively, when a high voltage is applied by the control circuit 112 to the gate of the FET 114, the high side FET 114 is in an ON state and current from the power supply Vpower can flow through the FET 114 and to the load element 130.

The drive circuit 110 includes a high side control circuit 112 for controlling the high side FET 114 in response to one or more control signals provided by the data processor 102 (e.g., microprocessor or microcontroller). The microprocessor is connected to receive control inputs, user inputs, and/or sensor inputs (not shown) which are used to determine when the LOW and HIGH voltages are applied to the gate of the FET 114 for purposes of controlling the application of the output voltage signal 115 to the load element 130. For example, if the load element 130 is a high-intensity discharge (HID) xenon, halogen or light-emitting diode (LED) light source, the high side FET 114 may be implemented with an n-channel NMOSFET switch with extremely low on-resistance (e.g., ranging from 10 milliohms to 35 milliohms) that is turned on by a user input control signal to the data processor 102. For current control purposes, the high side control circuit 112 is arranged to control the operation of the high side FET 114 to provide latched over-current shutdown protection. Alternatively, the high side control circuit 112 is arranged to control the operation of the high side FET 114 such that it operates in a current limitation mode to limit the current to the current load 130 to one or more predetermined values. In addition, the high side control circuit 112 may use one or more performance profiles for different types of output loads 130 to precisely track the operation of the output load 130 and deliver optimal efficiency and greatest protection. For example, a halogen lamp draws high levels of current when first turned on, but much less current once it has stabilized. The high side control circuit 112 uses the profile(s) to accurately track the current drawn by the light source in the critical turn-on phase when high levels of current are needed, and to reduce the current during subsequent operation and quickly detect a potential over-current or short-circuit condition and turn off the lamp before failure occurs.

The high side control circuit 112 may also be used to provide diagnostics for the FET switch 114 to determine if there is a gate-drain short failure at the FET switch 114 (as indicated by the dashed line resistive short path 113 between the FET gate and drain). The device fault may be detected by floating the gate of the FET switch 114, and then comparing the output voltage of the FET switch 114 to a threshold voltage which may be selected as a percentage of the power supply voltage. If there is a gate-drain short 113 at the switch 114, the voltage at the floating gate is pulled toward the power supply voltage at the drain, causing the FET switch 114 to become partially enhanced in the linear region and increasing the output voltage 115 at the source of the FET switch 114. If the output voltage 115 is determined to greater than the threshold, a fatal fault condition is signaled to the data processor 102.

In an example implementation of the fault diagnostics system, the control circuit 112 may include a cutoff mechanism or circuit which causes the gate of the FET switch 114 to float. Though not shown, the cutoff mechanism may be implemented with a transmission gate coupled between the FET drive at the data processor 102 and the gate of the FET switch 114, where the transmission gate is formed by source-drain connecting a PMOS and NMOS transistor together in parallel so that the NMOS transistor is gated by a first control signal and the PMOS transistor is gated by the inverse of the first control signal. Once the gate of the FET switch 114 is floating, the output voltage 115 of the FET switch 114 under test is compared at a comparator circuit 118 to a threshold voltage Vthreshold which represents a certain percentage of the power supply voltage Vpower. If the output voltage 115 is determined to greater than the threshold voltage, then the comparator circuit 118 recognizes that a fatal fault condition has occurred at the FET switch 114, and notifies the data processor 102 via serial protocol interface (SPI) bus fault register flag or hardware fault flag 119. The fault flag 119 functions as an output signal from the comparator circuit 118 can be used as an MCU interrupt to the data processor 102 to immediately catch the fault occurrence, or can use periodic SPI fault register polling to check the status flag. Upon detecting a device failure or fault indicating the presence of a resistive short path 113 at the FET switch 114, the data processor 102 can manage and control the device failure in one or more different ways to prevent a thermal event from occurring at the FET switch 114. In selected embodiments, thermal events at a defective FET switch are managed by limiting the duration and number of activation cycles applied to the switch. In other embodiments when the device fault is signaled at fault signal 119, the data processor 102 and/or control circuit 112 manage the device failure at the system level by preventing the FET switch 114 from going into sleep mode or by preventing the gate at the switch 114 from floating. As long as the FET switch 114 is not in sleep mode, its gate is being actively pulled to ground, thereby overcoming the influence of the resistive gate-drain short 113 and keeping the FET switch 114 out of the linear region to prevent excess heat dissipation. Device failure can also be contained at the device level upon fault detection by implementing an anti-fuse 120 in the drive circuit 110 to permanently disable reset and sleep mode by connecting the reset input to the power supply voltage Vcc upon detection of the fault, thereby keeping the FET switch 114 out of the linear region and the preventing the excess heat dissipation. For example, with eXtreme switching devices, a reset pin is provided that places the switching device in sleep mode when the reset is activated (e.g., pulled low). With this reset configuration, the power supply voltage (Vcc=5V) could be connected to the reset pin by fusing an anti-fuse between the reset pin and the power supply voltage. This action would permanently connect reset pin to the power supply, and not allow the device to enter sleep mode. In yet other embodiments, the fatal fault notification signal 119 could be used by the data processor 102 to notify the automotive system user that the FET switch 114 is defective and needs to be serviced.

FIG. 2 illustrates a flow diagram 200 for the operation of a failure diagnostics system which detects FET device failures at a switching device in accordance with selected embodiments of the present invention. At step 201, the diagnostic test sequence is initiated at device wakeup, on reception of an SPI command, or on some other predetermined or recurring basis.

As an initial step, the gate of the FET device is floated (step 202), such as by disconnecting the FET gate from its drive signal source.

Once the gate is floating, the output voltage from the FET device (e.g., at the FET source) is compared to a threshold voltage (step 204), such as by applying the output voltage and threshold voltage as inputs to a comparator. By choosing the threshold voltage to be a percentage of the power supply voltage for the FET device, the comparison of the output voltage and threshold voltage can be used to detect a gate-drain short at the FET device. If the output voltage is not greater than the threshold voltage (negative outcome to decision 206), then the sequence loops ends or loops back to be re-started again later (at step 202). However, if the output voltage is greater than the threshold voltage (affirmative outcome to decision 206), this indicates that the voltage at the floating gate has been pulled toward the power supply voltage at the drain. The higher output voltage indicates that there may be a gate-drain short in the FET device which can cause the FET device to become partially enhanced in the linear region, possibly causing a destructive thermal event.

With a default detected, the device fault is detected and logged as a fatal condition (step 208). This device failure may be conveyed to the system by setting a serial protocol interface (SPI) bus fault register flag or hardware fault flag. At step 210, the damaged FET device is contained and/or disabled by applying device level and/or system level containment to the damaged FET device, thereby preventing a thermal event at the device level and system level. For example, an anti-fuse could be used to permanently disable sleep mode of the damaged FET device, or the FET gate could be prevented from floating so that the FET gate never goes into sleep mode, or the user could be notified of the device default.

At step 211, the diagnostic test sequence ends, though it will be appreciated, that the disclosed diagnostic test procedure may be applied at start-up, periodically, episodically, on user command, or on any other predetermined basis for performing a gate-drain short fault test.

By now, it should be appreciated that there has been provided herein a switching device, method, and system with built-in fault detection. The switching device includes a power switch, such as an n-channel NMOSFET switch with on-resistance ranging from 10 milliohms to 35 milliohms. The power switch is provided for connecting a power supply voltage at a drain terminal of the power switch to an output load arrangement at a source terminal of the power switch under control of a gate terminal of the power switch. In addition, the switching device also includes a cutoff circuit connected between the gate terminal of the power switch and a gate signal source for floating the gate terminal during a predetermined diagnostic event. The cutoff circuit may be implemented as a transmission gate coupled between the gate terminal of the power switch and a microprocessor that serves as the gate signal source. The switching device also includes a failure detection circuit for detecting a device failure by comparing a signal voltage at the source terminal of the power switch with a threshold voltage during the predetermined diagnostic event and providing an output fault signal only when the signal voltage greater than the threshold voltage. The threshold voltage represents a predetermined percentage of the power supply voltage. The failure detection circuit may be implemented as a comparator circuit which compares the signal voltage to the threshold voltage when the gate of the power switch is floating and provides the output fault signal as an output of the comparator circuit only when the signal voltage greater than the threshold voltage. The output fault signal can be provided by setting a serial protocol interface bus fault register flag or hardware fault flag, and or can be used to notify a user that the power switch is defective. In addition, the switching device may include a fault containment circuit for preventing the gate terminal at the power switch from floating after the failure detection circuit detects that the signal voltage is greater than the threshold voltage during a predetermined diagnostic event. In addition or in the alternative, an anti-fuse may be provided with the switching device for connecting a reset input to the power supply voltage after the failure detection circuit detects that the signal voltage is greater than the threshold voltage during a predetermined diagnostic event, thereby preventing the switching device from entering a sleep mode. In selected embodiments, the power switch, cutoff circuit, and failure detection circuit are formed in a single integrated Power Quad Flat Pack No Lead (PQFN) package, and are controlled by signals from an external microcontroller unit to detecting the device failure during the predetermined diagnostic event. Finally, a processor circuit may be provided for receiving the output fault signal from the failure detection circuit and for generating an event signal to trigger a fault containment event in response to the output fault signal.

In another form, there is provided a method for testing an integrated circuit field effect transistor (FET) device that is drain-source coupled between power supply and an output load under control of a gate electrode. In the disclosed methodology, the gate electrode of the FET device is floated during a predetermined diagnostic event (e.g., during sleep mode), such as by activating a cutoff circuit coupled between the gate electrode of the FET device and a gate signal source. During this time, a source voltage at the source of the FET device is compared to a predetermined threshold voltage to detect a failure at the FET device if the source voltage exceeds the predetermined threshold voltage. If a failure is detected, a fault is logged, such as by setting a serial protocol interface bus fault register flag or hardware fault flag. In addition, the gate electrode at the FET device may be prevented from floating in response to detecting a failure at the FET device. Also, the FET device may be prevented from entering a sleep mode by connecting the reset input to the power supply upon detection of the fault. In other embodiments, an automotive system user may be notified that the FET device is defective and needs to be serviced in response to detecting a failure at the FET device.

In yet another form, there is provided a failure diagnostics system which includes a drive switch and a diagnostic circuit arrangement. The disclosed drive switch is operable to provide a drive signal at an output in response to a gate signal supplied to a gate of the drive switch. The disclosed diagnostic circuit arrangement is operable for floating the gate of the drive switch during the predetermined diagnostic event and detecting a failure of the drive switch by comparing the output from the drive switch with a threshold voltage representing a predetermined percentage of a power supply voltage for the drive switch, thereby providing an output fault signal only when the output from the drive switch is greater than the threshold voltage.

Although the described exemplary embodiments disclosed herein are directed to various embodiments, the present invention is not necessarily limited to the example embodiments which illustrate inventive aspects of the present invention that are applicable to a wide variety of multi-core process systems and operational methodologies. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. The term "coupled," as used herein, is not intended to be limited to a direct coupling or a mechanical coupling. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A switching device with built-in fault detection comprising:
    a power switch for connecting a power supply voltage that is coupled to a drain terminal to an output load arrangement that is coupled to a source terminal under control of a gate terminal;
    a cutoff circuit coupled between the gate terminal of the power switch and a gate signal source for floating the gate terminal during a predetermined diagnostic event; and
    a failure detection circuit for detecting a gate-drain short in the power switch by comparing a signal voltage at the source terminal of the power switch with a threshold voltage during the predetermined diagnostic event and providing an output fault signal only when the signal voltage is greater than the threshold voltage.

2. The switching device of claim 1, where the power switch, cutoff circuit, and failure detection circuit are formed in a single integrated Power Quad Flat Pack No Lead (PQFN) package.

3. The switching device of claim 1, where the power switch comprises an n-channel NMOSFET switch with on-resistance ranging from 10 milliohms to 35 milliohms.

4. The switching device of claim 1, where the cutoff circuit comprises a transmission gate coupled between the gate terminal of the power switch and a microprocessor that generates the gate signal source.

5. The switching device of claim 1, where the failure detection circuit comprises a comparator circuit which compares the signal voltage to the threshold voltage when the gate terminal of the power switch is floating and provides the output fault signal as an output of the comparator circuit only when the signal voltage greater than the threshold voltage.

6. The switching device of claim 1, where the failure detection circuit provides the output fault signal by setting a serial protocol interface bus fault register flag or hardware fault flag.

7. The switching device of claim 1, where the threshold voltage represents a predetermined percentage of the power supply voltage.

8. The switching device of claim 1, further comprising a fault containment circuit for preventing the gate terminal at the power switch from floating after the failure detection circuit detects that the signal voltage is greater than the threshold voltage during a predetermined diagnostic event.

9. The switching device of claim 1, further comprising an anti-fuse for coupling a reset input to the power supply voltage after the failure detection circuit detects that the signal voltage is greater than the threshold voltage during a predetermined diagnostic event, thereby preventing the switching device from entering a sleep mode.

10. The switching device of claim 1, where the output fault signal is used to notify a user that the power switch is defective.

11. The switching device of claim 1, where the power switch, cutoff circuit and failure detection circuit are controlled by signals from an external microcontroller unit to detecting the gate-drain short in the power switch during the predetermined diagnostic event.

12. The switching device of claim 1, further comprising a processor circuit for receiving the output fault signal from the failure detection circuit and for generating an event signal to trigger a fault containment event in response to the output fault signal.

13. A method for testing an integrated circuit field effect transistor (FET) device that is drain-source coupled between power supply and an output load under control of a gate electrode, the method comprising:
    floating the gate electrode of the FET device;
    comparing a source voltage at the source of the FET device to a predetermined threshold voltage to detect a gate-drain short in the FET device if the source voltage exceeds the predetermined threshold voltage; and
    logging a fault if a gate-drain short in the FET device is detected.

14. The method of claim 13, where the method for testing occurs during a sleep mode.

15. The method of claim 13, where floating the gate electrode comprises activating a cutoff circuit coupled between the gate electrode of the FET device and a gate signal source for floating the gate electrode during a predetermined diagnostic event.

16. The method of claim 13, where logging the fault comprises setting a serial protocol interface bus fault register flag or hardware fault flag.

17. The method of claim 13, further comprising preventing the gate electrode at the FET device from floating in response to detecting a gate-drain short at the FET device.

18. The method of claim 13, further comprising preventing the FET device from entering a sleep mode by connecting a reset input to a power supply upon detection of the fault.

19. The method of claim 13, further comprising notifying an automotive system user that the FET device is defective and needs to be serviced in response to detecting a gate-drain short at the FET device.

20. A failure diagnostics system comprising:
    a drive switch operable to provide a drive signal at an output in response to a gate signal supplied to a gate of the drive switch; and
    a diagnostic circuit arrangement for floating the gate of the drive switch during a predetermined diagnostic event and detecting a gate-drain short of the drive switch by comparing the output from the drive switch with a threshold voltage representing a predetermined percentage of a power supply voltage for the drive switch, thereby providing an output fault signal only when the output from the drive switch is greater than the threshold voltage.

* * * * *

UNITED STATES PATENT AND TRADEMARK OFFICE
CERTIFICATE OF CORRECTION

PATENT NO.        : 8,823,411 B2
APPLICATION NO.   : 12/701687
DATED             : September 2, 2014
INVENTOR(S)       : Christopher M. League Page 1 of 1

It is certified that error appears in the above-identified patent and that said Letters Patent is hereby corrected as shown below:

In the Claims

Col. 7, line 58 the word "is" is missing and the line should read "when the signal voltage is greater than the threshold voltage".

Signed and Sealed this
Eighteenth Day of November, 2014

Michelle K. Lee
*Deputy Director of the United States Patent and Trademark Office*